United States Patent [19]

Meyerhoff

[11] 4,405,836
[45] Sep. 20, 1983

[54] SIGNAL EQUALIZATION SELECTOR

[75] Inventor: Jerome D. Meyerhoff, Buffalo Grove, Ill.

[73] Assignee: Motorola, Inc., Schaumburg, Ill.

[21] Appl. No.: 336,979

[22] Filed: Jan. 4, 1982

[51] Int. Cl.$^3$ .............................................. H03G 5/16
[52] U.S. Cl. ................................. 179/1 D; 333/28 T; 455/233
[58] Field of Search ............... 179/1 D, 1 B, 1 AT, 179/1 SW, 1 MN; 333/18, 28 R, 28 T; 455/177, 200, 233

[56] References Cited

U.S. PATENT DOCUMENTS

| | | | |
|---|---|---|---|
| 3,663,755 | 5/1972 | Lace | 179/1 D |
| 3,868,576 | 2/1975 | Bagdasarjanz et al. | 325/65 |
| 4,031,319 | 6/1977 | Desai | 179/1 D |
| 4,046,960 | 9/1977 | Veale | 179/1 D |
| 4,166,197 | 8/1979 | Moog et al. | 179/1 D |
| 4,187,544 | 2/1980 | Larner | 179/1 MN X |
| 4,285,065 | 8/1981 | Priniski | 455/158 |
| 4,292,467 | 9/1981 | Odlen et al. | 179/1 D |

OTHER PUBLICATIONS

The Audio Cyclopedia, pp. 302-304 and 312-313, 1969.
The Audio Cyclopedia, pp. 592-594, 1977.
Radio Electronics, pp. 65-67, Dec. 1976.

Primary Examiner—G. Z. Rubinson
Assistant Examiner—W. J. Brady
Attorney, Agent, or Firm—James W. Gillman; James S. Pristelski; Phillip H. Melamed

[57] ABSTRACT

A combination radio and tape player is disclosed which includes a signal equalization selector wherein the audio program selection switches which select either an AM or FM radio mode or a tape player mode of operation also simultaneously select various different sets of stored control signals which implement predetermined audio signal equalization in accordance with the type of audio mode of operation (program) that was selected. This is accomplished by the use of a random access memory which stores three pluralities (sets) of control signals, each plurality of control signals corresponding to a predetermined desired equalization for either the AM, FM or tape player modes of operation of the combination radio and tape player. Manual controls are provided which allow selective adjustment of the equalization provided in any of the AM, FM or tape player modes of operation.

8 Claims, 9 Drawing Figures

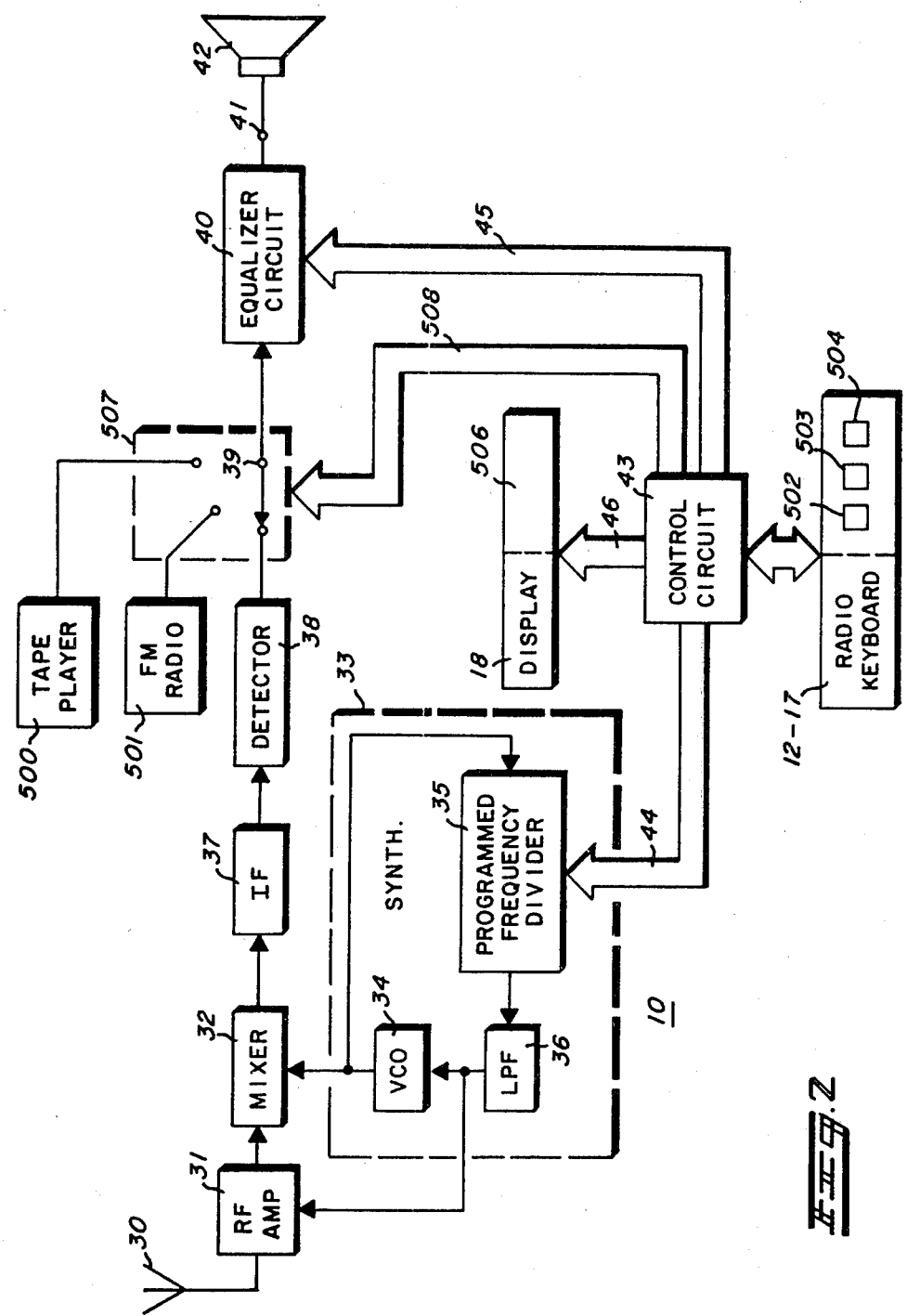

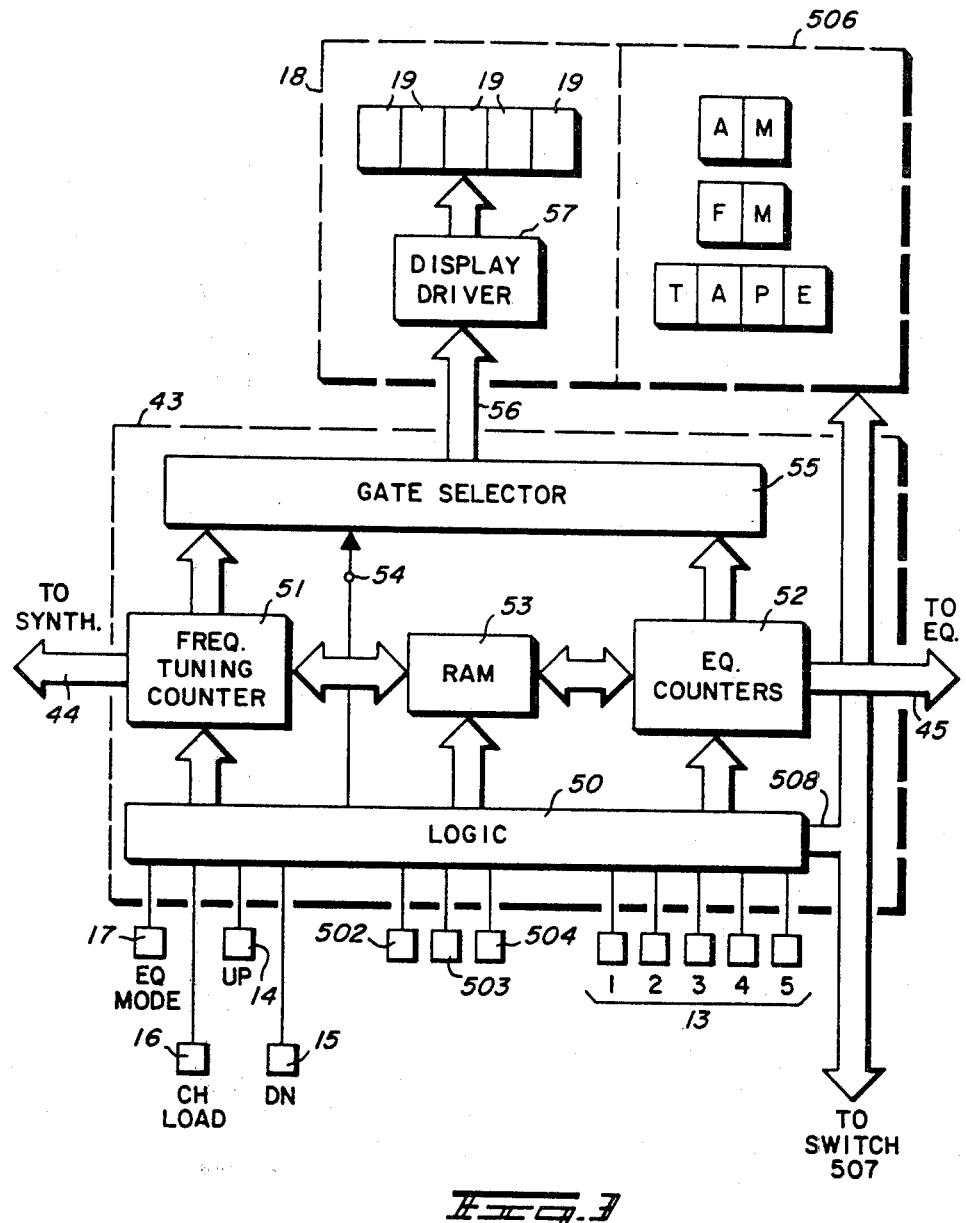

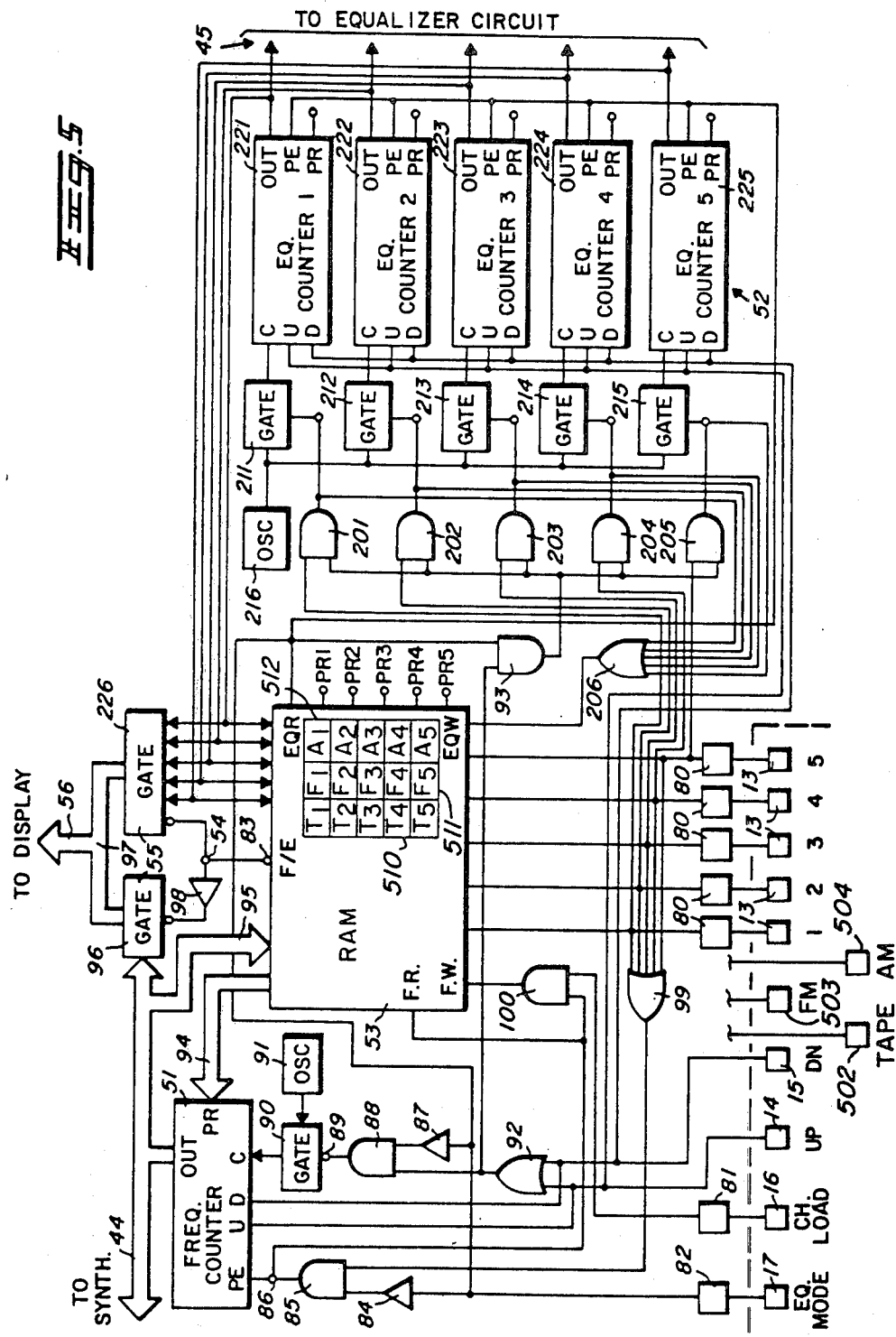

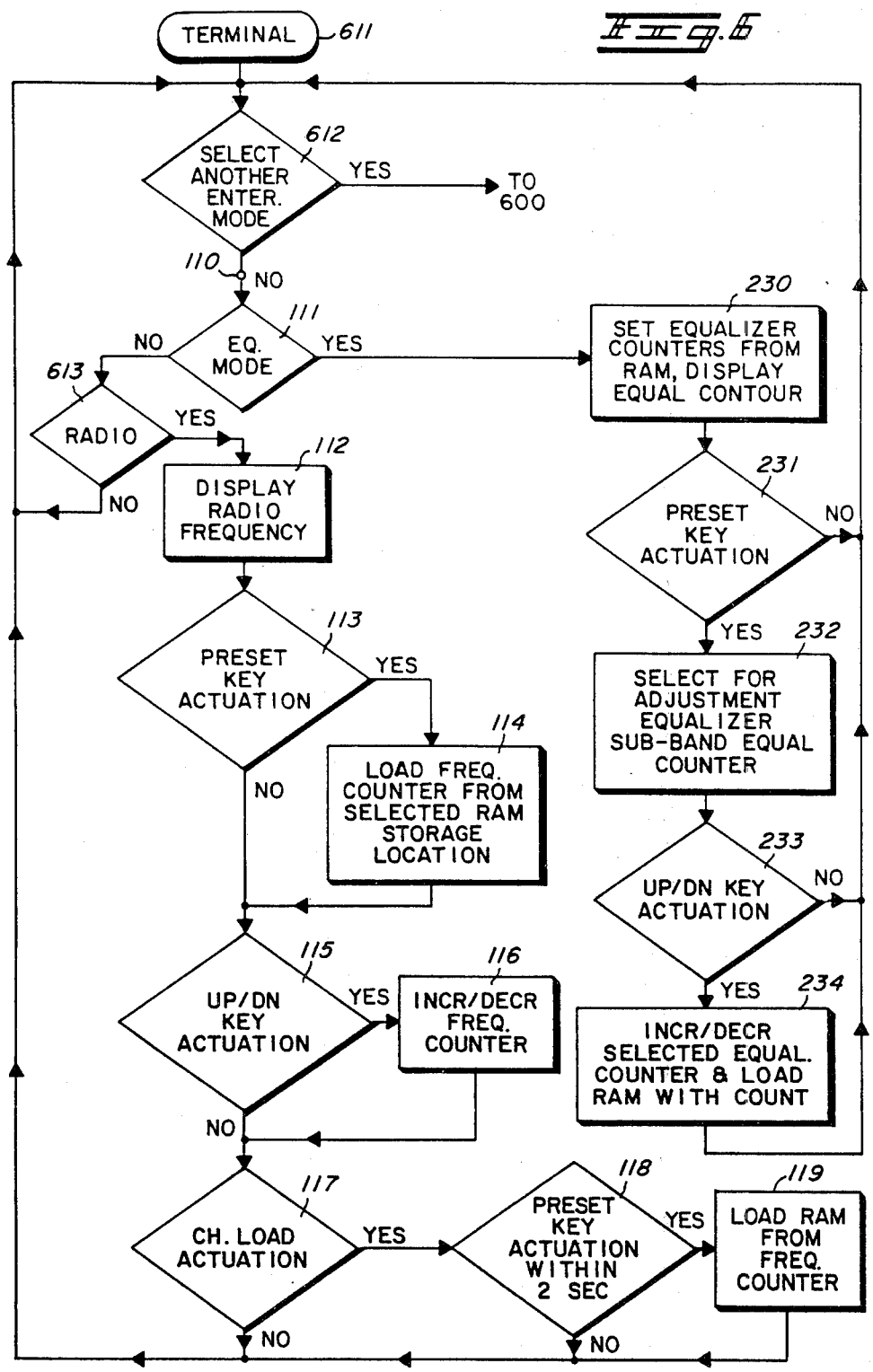

SIGNAL EQUALIZATION SELECTOR

BACKGROUND OF THE INVENTION

The present invention generally relates to the field of signal equalization circuits in which a selected signal undergoes selective relative emphasis of various frequency subbands which comprise the selected signal. More specifically the present invention relates to an improved audio signal equalization circuit in which an audio signal selector is not only used to determine which audio signal will be subjected to a desired predetermined signal equalization, but the signal selector also simultaneously and automatically selects one of several pluralities (sets) of stored control signals to implement the desired equalization while simultaneously selecting the audio signal which is to undergo equalization.

In general, audio equalizers are available which provide for the separate manual adjustment of the relative emphasis of a plurality of contiguous frequency subbands of a selected audio signal so that the audio frequency response of an entertainment device can be operator adjusted so as to suit the operator's personal preference. One such audio equalizer which provides this function through the use of a plurality of stored control signals which are stored in a random access memory (RAM) is illustrated in U.S. Pat. No. 4,285,065, entitled "Radio with Audio Graphic Equalizer", which is assigned to the same assignee as the present invention. That patent describes a AM radio having an integral audio equalizer in which stored digital equalizer control signals can be manually adjusted in their digital magnitude so as to provide the radio with an operator controllable audio equalization for the output audio signal of the radio.

A radio with an integral audio equalizer, such as that shown in the '065 patent, can be utilized to provide any desired audio equalization for its audio output. However, the radio in the prior patent appears to contemplate providing the same audio equalization for any audio signal which may be selected for equalization by any audio signal program selector, such as an AM or FM radio switch or a radio mode versus tape player mode switch, unless the equalization is additionally adjusted for each selected audio signal after the selection of the audio signal. The '065 patent does mention selectively implementing an equalizer "defeat" mode in which no relative audio emphasis is provided for any of the subbands in response to actuation of a equalizer defeat switch, but the manner of carrying this out is not described. Also it is clear that actuation of the equalizer defeat switch does not result in selecting a different audio signal for equalization, but merely implements an effectively different equalization for the same audio signal.

Some prior audio entertainment devices have recognized that different predetermined equalization characteristics may be desired for different selected audio entertainment signals. Typically these devices have implemented different signal equalizations for different selected audio signals by the selective coupling of fixed equalization circuits into the selected audio signal path in accordance with what audio program signal has been selected. In other words, if an AM radio mode of operation were selected, a first fixed equalization circuit, such as a 10 kHz whistle notch filter, would be switched into the audio signal path whereas if a record player mode of operation were selected a second equalization circuit, such as a low frequency rumble filter, would be switched into the audio signal path. These types of prior signal equalization selector assemblies have heretofore only involved the use of fixed equalization networks, thus depriving the operator of the entertainment device, unless additional equalization circuits are used, of the ability to selectively adjust the amount of equalization to his own personal taste for each of the different types of audio program signals which may be selected.

SUMMARY OF THE INVENTION

An object of the present invention is to provide an improved signal equalization selector and entertainment device which overcomes the deficiencies of the above recited prior devices.

A more particular object of the present invention is to provide an inexpensive signal equalization selector in which an audio signal program selector is used not only to select what audio signal will be subjected to equalization, but also to automatically select one of several pluralities (sets) of stored control signals to act as equalizer control signals to thereby automatically provide desired equalization in accordance with the selected audio signal. Preferably, the signal equalization selector of the present invention allows for operator adjustment of all of the stored controlled signals such that the resultant frequency response of the audio entertainment device for each selected audio program signal may be pre-adjusted in accordance with the desires of the entertainment device operator.

According to one embodiment of the present invention a signal equalization selector is provided. The signal equalization selector comprises: signal source selector means for selecting a first one of a plurality of signal sources for providing a desired selected signal comprising frequencies within a predetermined frequency band; equalizer means coupled to said signal source selector means for receiving said selected signal and effectively adjusting the relative emphasis of said selected signal in each of a plurality of subbands within said frequency band, the emphasis of said selected signal in each of said subbands being in accordance with an associated subband equalizer control signal received by said equalizer means for each of said subbands; memory means for storing at least a first plurality of predetermined control signals and effectively supplying said first plurality of control signals to said equalizer means as said equalizer control signals while said first one of said plurality of signal sources is selected by said signal source selector means; wherein the improvement comprises said memory means storing at least a second plurality of predetermined control signals, and wherein said signal source selector means has structure for selecting a second one of said plurality of signal sources to provide said selected signal and also simultaneously selecting by selective coupling between said equalizer means and control signals stored in said memory means, said second plurality of control signals, instead of said first plurality of control signals, as said equalizer control signals, whereby equalization for signals derived from said first and second signal sources occurs in accordance with said first and second pluralities of stored control signals, respectively.

The preferred embodiment of the present invention utilizes manual pushbuttons as part of the signal source selector means in order to select either AM, FM or tape player modes of operation such that the signal to be subjected to the selected equalization provided by the present invention will comprise an audio entertainment signal provided by AM, FM or tape player apparatus. In addition, it is contemplated that the present invention will enable the selective magnitude adjustment of each of the stored control signals contained in the memory means such that the equalization automatically provided in accordance with the selection of what type of audio signal is selected by the signal source selector means can be operator pre-adjusted.

The present invention represents an improvement to the radio with an internal audio graphic equalizer which is illustrated in prior U.S. Pat. No. 4,285,065. While the prior patent provided an operator pre-adjustable equalization circuit, the present invention involves the use of an audio program selector to automatically select operator adjustable preset control signals so as to automatically provide a desired equalization characteristic for each of various different audio signal sources which can be selected.

BRIEF DESCRIPTION OF THE DRAWINGS

For a more complete understanding of the present invention references should be made to the drawings, in which:

FIG. 2 is a schematic diagram illustrating in block form the electrical components, including a control circuit, display and equalizer circuit, of the entertainment device shown in FIG. 1;

FIG. 3 is a simplified block diagram of the control circuit and display shown in FIG. 2;

FIG. 5 is a detailed schematic diagram of a possible embodiment for the components illustrated in FIG. 3;

FIG. 6 is a flowchart for the operation of the circuitry shown in FIG. 5;

DESCRIPTION OF THE PREFERRED EMBODIMENT

Figure 1:
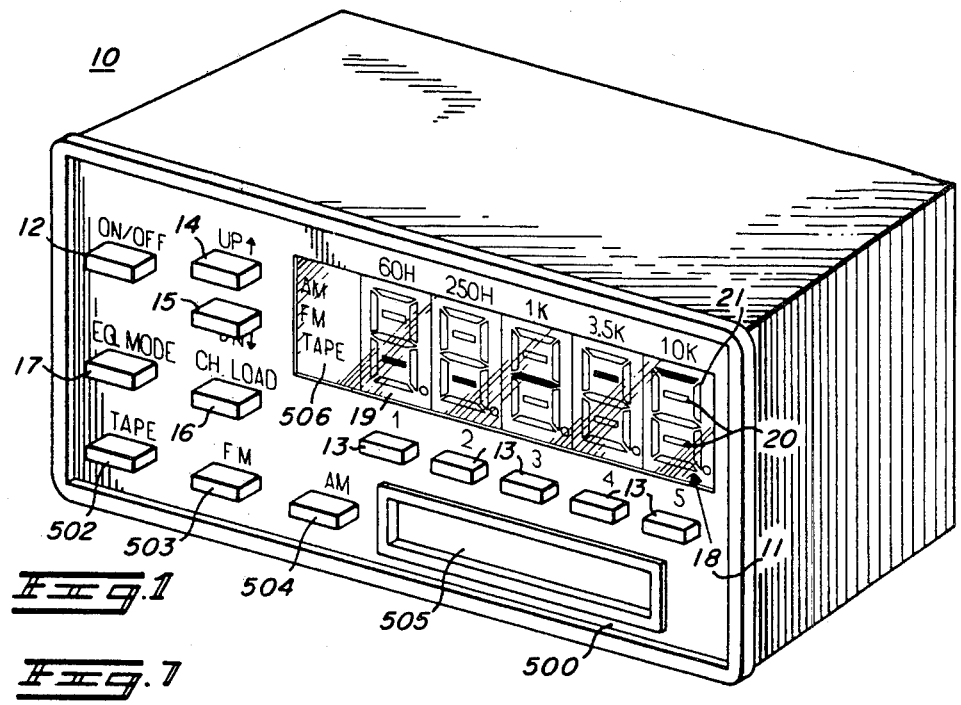
FIG. 1 is a perspective view of a combination radio receiver and tape player entertainment device having an integral audio graphic equalizer.

FIG. 1 illustrates an entertainment device 10 comprising a combination radio receiver and tape player having an integral audio signal equalizer. The entertainment device 10 represents an improved entertainment device utilizing the radio receiver 10 illustrated and described in U.S. Pat. No. 4,285,065 which is assigned to the same assignee as the present invention. The '065 U.S. patent contains a complete description of the operation of a radio receiver having an integral audio signal equalizer and that description hereby is incorporated by reference as forming part of the description of the present invention. The drawings of the present invention, whenever possible, utilize the same reference numbers that are utilized in the '065 patent, and the operation of all components identified by reference numbers less than the number 500 are fully described in the '065 patent and therefore the operation of these components will only be briefly described herein. All components identified by reference numbers 500 and above represent additional structure which has been added to the radio receiver illustrated in the '065 patent. In all Figures of the present invention, identical reference numbers are utilized to illustrate corresponding structures.

The present invention involves adding a tape player mechanism 500 and FM radio circuitry 501 to the AM radio circuitry illustrated in the '065 patent and represented by the components 30–38 shown in FIG. 2. The components 30–38 basically illustrate a superheterodyne receiver which is electronically controlled by a control circuit 43 that controls a frequency synthesizer 33 which comprises a phase locked loop. The operation of the above recited components is conventional and is described in detailed in the '065 patent.

The present invention involves providing signal source program selector control pushbuttons 502, 503 and 504 for selecting either a tape player, an FM radio or an AM radio mode of operation for the combination radio and tape player 10. The controls 502–504 are positioned on a front control panel 11 which also contains additional manual controls 12–17 which implement various frequency tuning and equalizer control functions that are fully described in the '065 patent. The tape player structure 500 shown in the FIG. 1 of the present invention also includes a tape cassette receiving opening 505 present on the front panel 11. A display 18 is utilized to selectively provide either a five digit frequency indicating display or a graphic illustration of the degree of relative emphasis of five audio subbands for the audio output provided by the combination entertainment device 10 wherein these audio subbands are contiguous and include the reference frequencies of 60 Hz, 250 Hz, 1 KHz, 3.5 KHz and 10 KHz.

The display 18 also includes a display portion 506 wherein a visual indication of the selected entertainment mode for the combination device 10 is provided. This is accomplished by selectively illuminating identifying graphics corresponding to the legends "AM", "FM", or "TAPE". In response to the selective actuation of any one of the pushbuttons 502–504, a corresponding entertainment mode of operation will be selected for the combination entertainment device 10 resulting in the selective illumination of one of the identifying visual graphic legends that are part of the display portion 506.

The essence of the present invention involves the use of the pushbuttons 502–504, not only to select the entertainment mode for the device 10, but also to automatically and simultaneously provide different preset audio signal equalizations for the audio output of the entertainment device 10 in accordance with which entertainment mode is selected. This can best be illustrated by initially referring to the schematic block diagram shown in FIG. 2 of the present drawings.

FIG. 2 illustrates the connection of the program selector switches 502–504, as well as the other radio keyboard controls 12–17, to a control circuit 43 which effectively controls the tuning of the AM radio, corresponding to the components 30–38, via a control connection path 44. The control circuit 43 also controls the display 18 via a connection path 46 while simultaneously controlling an equalizer circuit 40 via a connection path 45. The equalizer circuit 40 receives an audio frequency electrical signal at a terminal 39, performs selective audio equalization on this signal in accordance with equalizer control signals received via the path 45 and provides an equalized audio signal at an output terminal 41 which is directly coupled to a speaker 42. The manner in which the controls 12–17 interact with control circuit 43 to control the AM radio, the display 18 and the equalizer circuit 40 is fully described in the '065 U.S. patent and will therefore only be briefly described herein.

Figure 7:
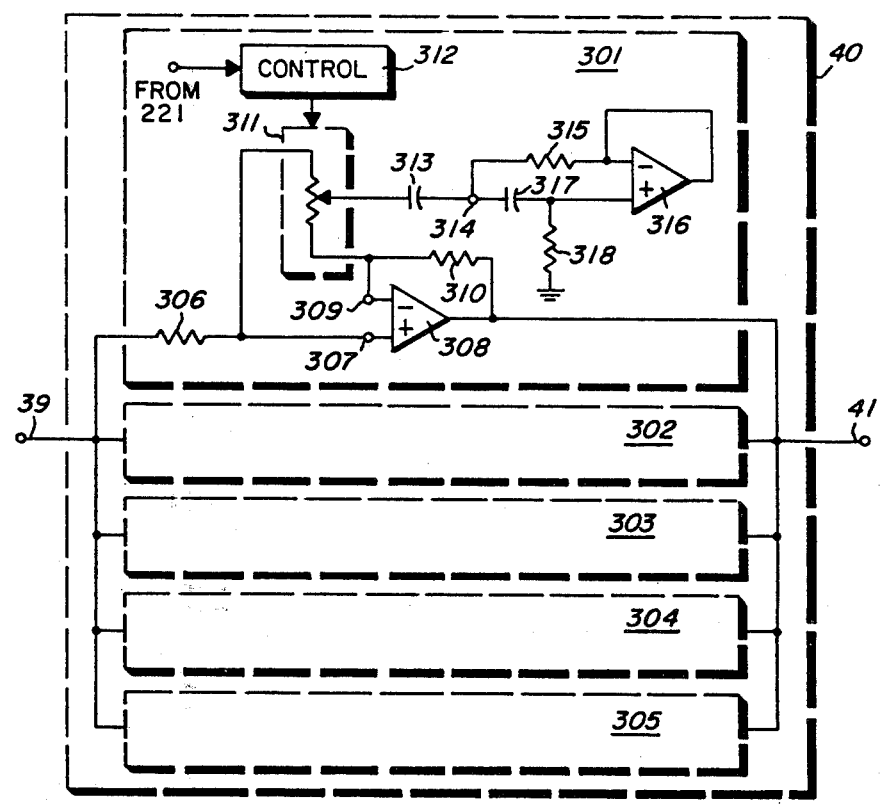
FIG. 7 is a schematic diagram illustrating a typical structure for the equalizer circuit shown in FIG. 2.

Essentially, pushbuttons 13 are used during a radio mode to provide for recalling preset radio channel frequencies and tuning the AM radio thereto. In an equalizer mode, which is selected by every other actuation of a pushbutton 17, the pushbuttons 13 are then utilized to designate one of the five audio subbands for which it is desired to alter the amount of relative audio emphasis. During the radio mode, the pushbuttons 14 and 15 are used to increment or decrement the frequency that the AM radio is tuned to in discrete increments, whereas in the equalizer mode these same pushbuttons are utilized to adjust the relative audio emphasis of the audio subbands selected by the depression of one of the pushbuttons 13. In the radio mode, the display 18 provides a five digit digital indication of the frequency to which the AM radio is tuned, whereas during the equalizer mode the display 18 will provide a five horizontal segment bar graph visual indication indicative of the relative audio emphasis in the five audio subbands. A channel load pushbutton 16 is utilized in the ratio mode to load desired channel frequency information in memory locations in a random access memory (RAM) 53 wherein these stored frequencies are selectively recalled by depressing one of the pushbuttons 13. In the equalizer mode the channel load pushbutton 16 is used to load (read in) equalizer control signals into the RAM 53. The random access memory 53 is used to initially set five independent equalizer counters 221–225 which are collectively designated by the reference number 52 and the output of these counters is utilized to control the equalizer circuit 40, a typical embodiment of which is shown in FIG. 7. The manner in which all of the above is accomplished is fully described in the prior '065 patent and therefore will not be discussed further in detail.

The essence of the present invention involves how the pushbuttons 502–504 are utilized not only to act through the control circuit 43 to select different audio signal sources during the implementation of different entertainment modes for the device 10, but how these pushbuttons also simultaneously and automatically select various presettable corresponding pluralities of stored equalizer control signals which are to be supplied to the equalizer circuit 40 via the control path 45. This can best be illustrated as follows.

In FIG. 2, the control circuit 43 is coupled to an electronic selector switch 507 (shown dashed) via a control path 508. The switch 507 comprises an electrically controlled switch wherein the input terminal 39 of the equalizer circuit 40 is selectively connected to either the audio output signal of the detector 38, the audio output signal of the FM radio 501 or the audio output signal of the tape player 500 in accordance with which of the pushbuttons 502–504, respectively, has been most recently actuated. The switch 507 can be readily implemented by standard logic circuits, such as a multiplex circuit, or through the use of relays or switching diodes, and the exact manner of implementing the switch 507 is not essential to the present invention. All that matters is that electrical control signals are provided by the control circuit 43, via the control path 508, which effectively result in the switch 507 providing a signal source selector function which selects one of a plurality of audio signal sources for providing a desired selected audio signal as the input to the equalizer circuit 40. This selected audio signal will comprise audio frequencies within the audio frequency band that encompasses all of the audio subbands for which equalization will be provided. The present invention contemplates actuation of any one of the pushbuttons 502–504 as not only acting on the switch 507 through the control path 508, but also automatically altering the control signals provided to the equalizer 40 via the control path 45 such that different preset equalizations will implemented in accordance with which audio signal source is selected by the switch 507.

FIG. 3 illustrates a simplified block diagram of the control circuit 43 shown in FIG. 2. FIG. 3 illustrates that the pushbuttons 502–504, along with manual controls 13–17, are connected as inputs to a logic circuit 50 which interacts with the AM frequency tuning counter 51, the plurality of five equalizer counters 52 and the random access memory 53. The manner in which the manual controls 13–17 interact with the logic circuit 50 is explained in detail in prior U.S. Pat. No. 4,285,065 which was previously noted. Essentially the logic circuit 50 also responds to the pushbuttons 502–504 to provide select control signals which control the switch 507 via the control path 508, and these select signals also interact with the RAM 53 and equalizer counters 52 to selectively provide desired preset audio equalization characteristics in accordance with which of the pushbuttons 502–504 has been actuated.

FIG. 5 illustrates in substantially more detail the interconnections between the circuitry which comprises the logic circuit 50 and the frequency and tuning counters 51 and 52 and the random access memory 53. Essentially, FIG. 5 of the present invention directly corresponds to FIG. 5 in the issued U.S. Pat. No. 4,285,065 except that the pushbuttons 502–504 are generally indicated as being coupled to logic circuit 50, and the RAM 53 is indicated as comprising 3 column arrays 510, 511 and 512 of storage locations, each array consisting of 5 storage locations. In the issued '065 U.S. patent only a single column array of 5 storage locations was contemplated and these locations were directly and permanently connected to the RAM output terminals PR1–PR5 as well as to equalizer read-in connections derived from the outputs of the equalizer counters 221–225. In the issued U.S. Pat. No. 4,285,065 it is explained in detailed how the existing manual controls 13–17 are utilized to selectively adjust the magnitude of digital signals contained in 5 ROM storage locations such that these locations store equalizer control signals that are used to preset the equalizer counters 221–225 which in turn each supply a digital control signal to the equalizer circuit 40 for selectively implementing desired audio equalization.

Essentially the present invention contemplates utilizing actuation of any one of the pushbuttons 502–504 to select not only an audio signal source, via the switch 507, but also to simultaneously select different sets of preset storage locations in the RAM 53 which correspond to the audio signal selected by the switch 507. In this manner the pushbuttons 502–504 will not only select a desired audio signal source, but also automatically select a preset audio equalization for the selected audio signal by selecting which one of the three column storage arrays 510–512 will be connected to the output terminals PR1–PR5 of the RAM 53 while also coupling these storage locations to the equalizer read input connected derived from the outputs of the counters 221-225.

It should be noted that in FIG. 5, the five storage locations used to store preset digital control signals related to the amount of audio equalization desired in each of the audio subbands for an AM radio audio signal are stored in storage locations designated $A_1$-$A_5$, whereas the FM storage locations are designated by the array $F_1$-$F_5$, and the tape equalization storage locations are designated by the array $T_1$-$T_5$. The storage locations T, F and A are designated by the column array reference numerals 510, 511 and 512, respectively.

Initially, the operation of the present invention will be described with reference to the information flowcharts shown in FIGS. 4, 6 and 9. Subsequently, the structure illustrated in FIG. 8 will be discussed with respect to how this circuitry, when utilized in conjunction with the circuitry shown in FIG. 5, implements the operations disclosed in the flowcharts. In all subsequent discussions it should be noted that all components having reference numerals less than 500 and all flowchart steps having reference numerals less than 600 are shown and described in issued U.S. Pat. No. 4,285,065. The present invention represents adding additional components and flowchart steps to the embodiment shown in the prior '065 patent so as to provide for implementing selective equalization in accordance with which audio signal source is selected for the audio output of the combination entertainment device 10. These additional components have reference numerals of 500 and above, and these additional flowchart steps have reference numerals of 600 and above.

Figure 8:
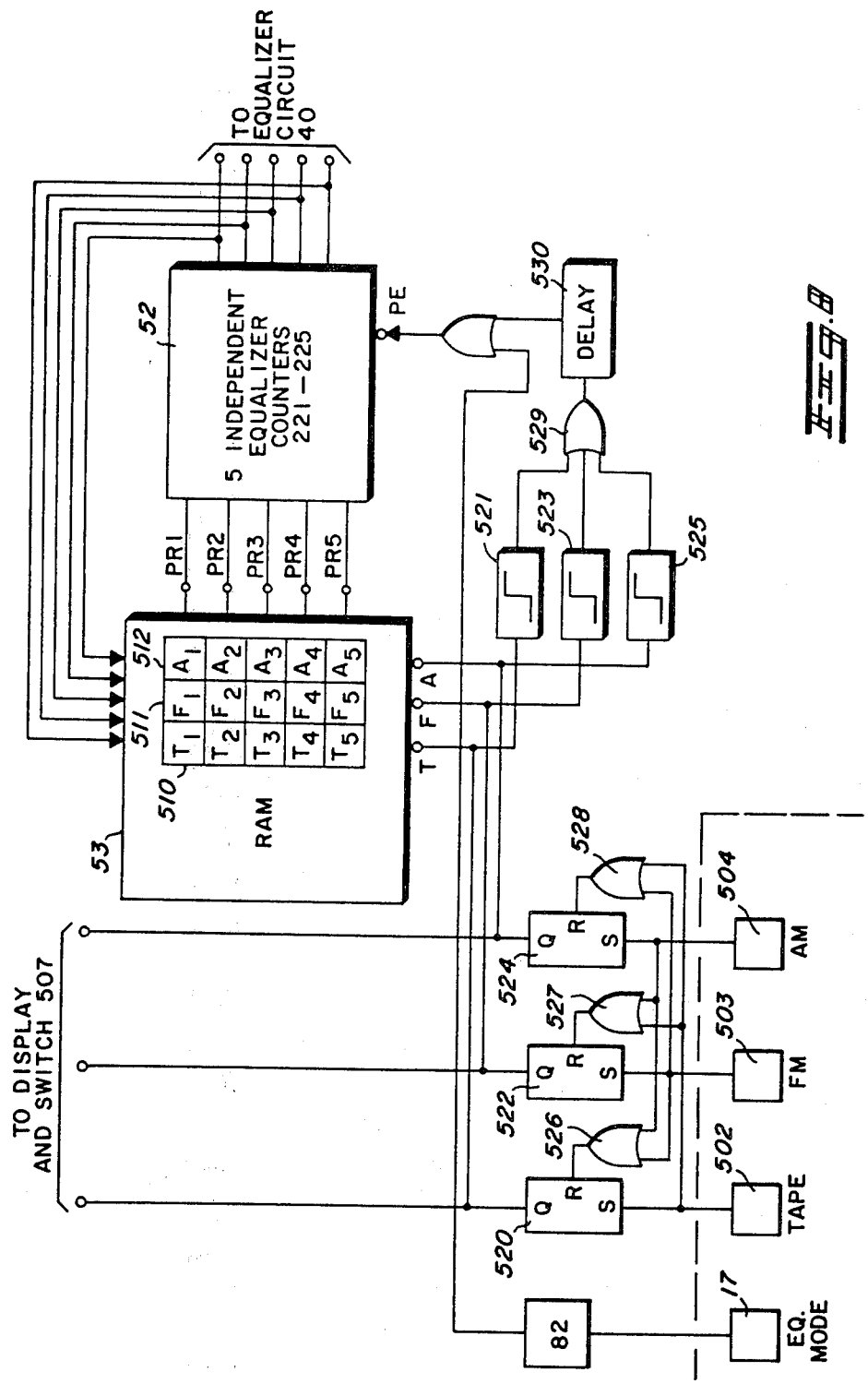
FIG. 8 is a detailed schematic diagram of addition components which are intended for cooperation with the components shown in FIG. 5.

Throughout the following explanation of the present invention it should be noted that preferably the present invention is implemented by a microprocessor which results in realizing the flowcharts shown herein and which essentially is the equivalent of the hardware embodiment shown in FIGS. 5 and 8. This is substantially similar to the operation of the radio receiver described in the '065 patent which also preferably contemplated microprocessor operation while illustrating an equivalent hardware embodiment.

Figure 9:
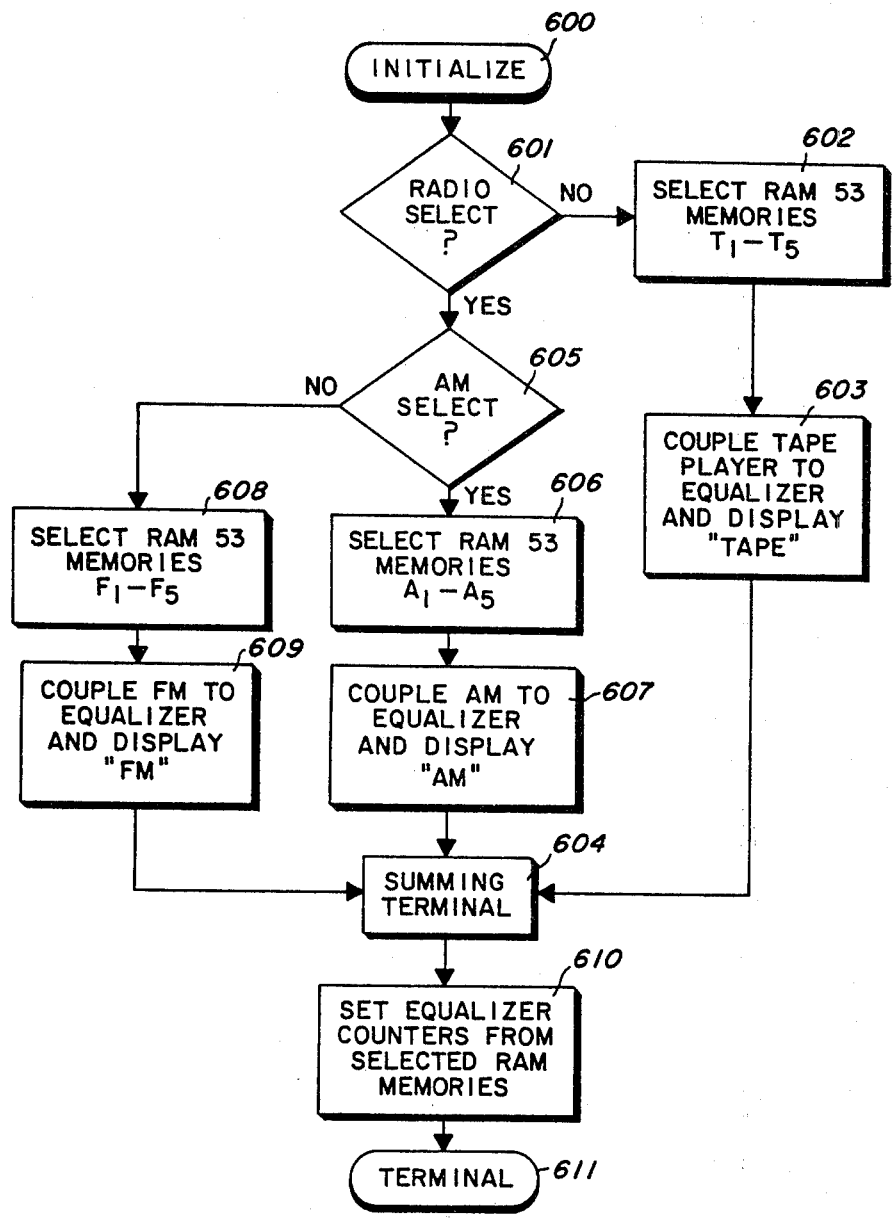
FIG. 9 is a partial flowchart which details additional information flow steps associated with the flowcharts shown in FIGS. 4 and 6.

Referring to FIG. 9, an initializing flowchart is illustrated which starts at initializing point 600. The information flow then proceeds to a decision block 601 which determines if the pushbuttons 502-504 have selected a radio mode of operation for the combination device 10. This essentially corresponds to whether the pushbuttons 503 or 504 have been actuated such that the switch 507 will select either the AM radio comprising the components 30-38 or the FM radio 501. In the event that neither of these two pushbuttons have been actuated, the decision block 601 determines that a tape mode is desired for the combination device 10 by virtue of the actuation of the pushbutton 502. In this case information flow then proceeds to a process block 602 which effectively selects the RAM 53 memory array locations $T_1$-$T_5$ for connection to the RAM equalizer output terminals PR1-PR5, as well as coupling these locations to the equalizer read input connections derived from the output of the counters 221-225. From the process block 602 information flow then passes to an additional process block 603 which results in coupling the audio output signal of the tape player 500 to the equalizer circuit 40 and also selectively illuminating only the graphic legend "TAPE" in the display portion 506. Then information flow passes to a summing terminal 604.

In the event that a radio mode has been selected by depressing (actuating) either of the pushbuttons 503 or 504, information flow from the decision block 601 passes to a decision block 605 which determines whether an AM or FM radio mode operation has been selected. In the event of the selection of an AM mode of operation, information flow from the decision block 605 passes to a process block 606 which results in effectively selecting the RAM 63 memory locations $A_1$-$A_5$ for connection to the output terminals PR1-PR5 and connection to the equalizer read inputs derived from the counters 221-225. From the process block 606 information flow passes to a process block 607 which results in coupling the AM radio audio output signal present at the detector 38 to the equalizer circuit 40 and also illuminating only the graphic legend "AM" in the display portion 506. After the process block 607 information flow passes to the summing terminal 604.

In the event that an FM mode of operation has been selected by depressing the pushbutton 503, information flow from decision block 605 passes to the process block 608 which selects the memory storage locations $F_1$-$F_5$, and then to a process block 609 that couples the audio output signal from the FM radio 501 to the equalizer 40 while illuminating only the "FM" graphic in display portion 506. From the process block 609 the information flow passes to the summing terminal 604.

From the summing terminal 604 information flow passes to a process block 610 which results in setting each of the equalizer counters 221-225 to preset counts determined by the RAM 53 memory locations selected by the last actuation of one of the pushbuttons 502-504. After the process block 610 information flows through a terminal 611 which appears as the input terminal for the flowcharts illustrated in FIGS. 4 and 6.

Essentially, the process blocks 602, 606 and 608 merely represent how the RAM 53 responds to actuation of any one of the pushbuttons 502-504 by selectively coupling only one of three possible arrays of memory locations to the equalizer output and input connections of the RAM. This can be readily implemented by standard logic gating or by utilizing a RAM having a page memory recall wherein in response to received control signals different storage locations are accessed.

The process blocks 603, 607 and 609 respond to the actuation of the pushbuttons 502 through 504 by coupling various audio output signals as inputs to the equalizer circuit 40. These operations are provided by the switch 507, which as previously noted can merely comprise standard logic gates, multiplex circuits, relays or diode switching circuits, any and all of which are contemplated as being usable with the present invention. These same type of standard components are also contemplated as being utilized to implement the selective illumination of graphics in the display portion 506.

The process block 610 represents the step of loading the equalizer counters 221-225, which control the audio equalization to be implemented, with the magnitudes of the digital signals contained in the equalizer storage locations selected by the actuation of one of the pushbuttons 502-504. This is accomplished by providing a preset enable pulse to all of the counters 221-225 and FIG. 8 illustrates a hardware embodiment which will result in this desired end result.

Figure 4:
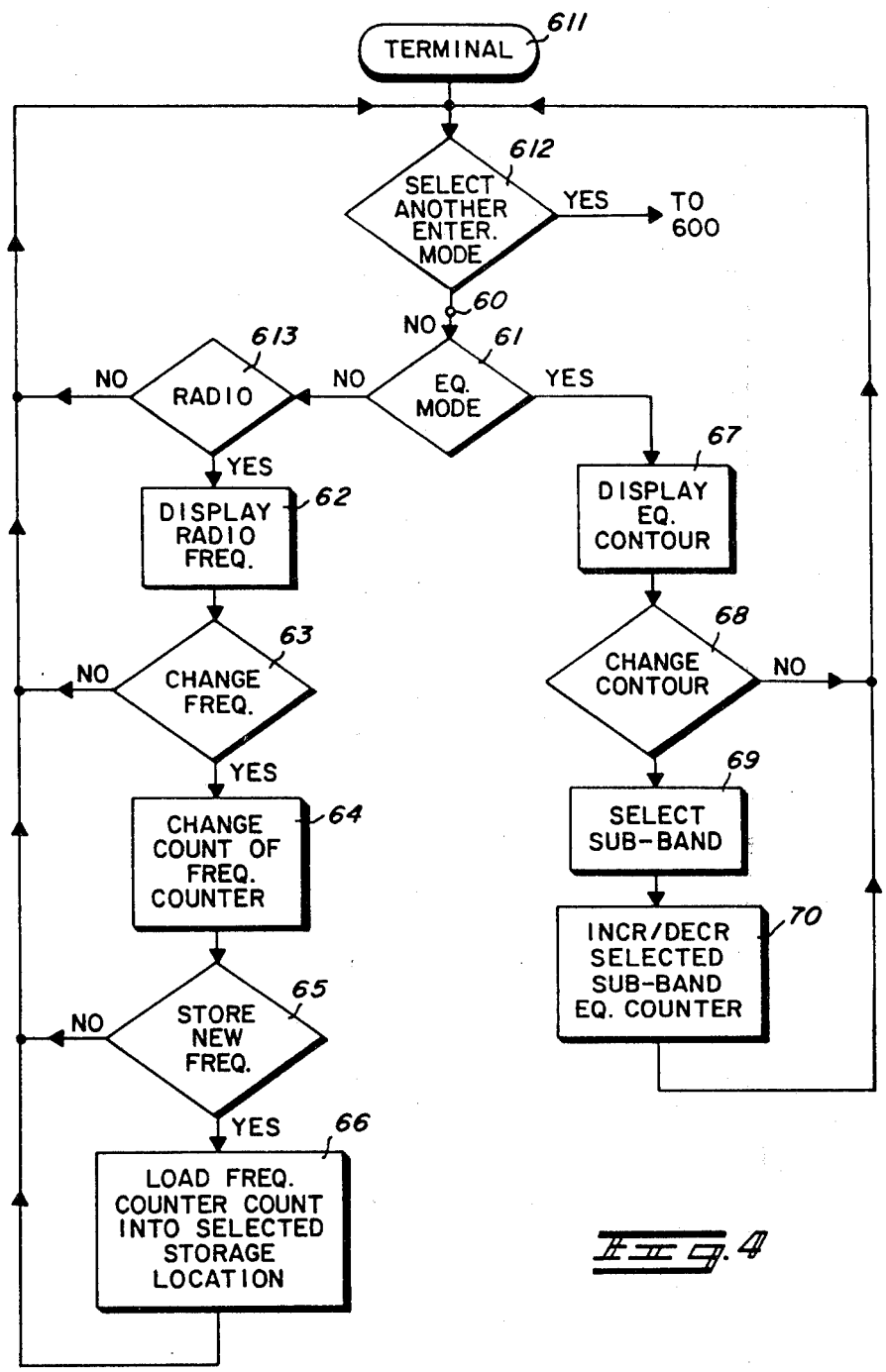
FIG. 4 is a flowchart for the operation of the components shown in FIG. 3.

In the flowchart shown in FIG. 4, information flow from the input terminal 611 passes to a decision block 612 which essentially monitors the pushbuttons 502-504 and determines if an entertainment mode different from the mode which already exists for the entertainment device 10 has been selected by actuation of one of the pushbuttons 502-504. If so, information flow then recycles to the initializing terminal 600 in the flowchart shown in FIG. 9. If not, information flow passes to the decision block 61 which determines whether or not an equalizer mode (which represents enabling the device 10 to adjust the amount relative audio emphasis while displaying the relative audio emphasis) has been selected by actuation of the equalizer mode pushbutton 17. The remaining right side portions of the flowchart in FIG. 4 merely represent the operation of the integral graphic equalizer shown in issued U.S. Pat. No. 4,285,065 wherein if an equalizer mode is set up a visual graphic display is provided and adjustment of the amount relative audio emphasis is possible through the use of the controls 12-17. If no equalizer mode is selected, then, assuming that a radio mode has been selected by pushbuttons 502-504, a decision block 613 results in, via process block 62, the display 18 indicating the radio frequency that the device 10 is tuned to, and the controls 12-17 are utilized for radio tuning purposes. If a radio mode has not been selected by pushbuttons 502-504, thus indicating the selection of a tape player mode, and the equalizer mode has also not been selected by actuation of pushbutton 17, then the decision block 613 results in recycling the information flow to the terminal 611. It is contemplated that in this situation the display 18 will not provide a tuned frequency or equalization display. The flowchart in FIG. 6 has a similar configuration and merely represents a more detailed flowchart implementing the same functions that are implemented by the flowchart in FIG. 4.

Basically the crux of the present invention resides in the flowchart in FIG. 9 since this flowcharts illustrates how the combination entertainment device 10 selects one of several possible audio signal sources to provide a desired audio entertainment signal while also simultaneously recalling preset stored equalizer control signals associated with the selected audio signal. Basically, the apparatus shown in FIG. 8 illustrates a typical hardware implementation for the flowchart shown in FIG. 9 and the apparatus in FIG. 8 will now be described.

As was previously noted, FIG. 8 is a partial schematic which illustrates components to be added to the apparatus shown in FIG. 5 so as to implement the present invention. In FIG. 8, manually actuable pushbuttons 17 and 502-504 are illustrated. The equalizer mode pushbutton 17 is coupled through a latch circuit 82 to the preset enable terminal (PE) of the five independent equalizer counters 221-225. The latch 82 is a toggle latch which responds to each actuation of the pushbutton 17 by altering its output stage thus providing for alternately implementing and terminating the equalizer mode in response to each actuation of the pushbutton 17. When an equalizer mode is to be implemented, it is contemplated that the latch 82 will switch its output state from low to high and provide a high logic output signal to the preset enable terminal. In response to the low to high logic transition provided at the preset terminal PE, each of the five equalizer counters 221-225 will be loaded with the stored digital control signals provided at the output terminals PR1-PR5 of the RAM 53. While the direct connections of the terminals PR1-PR5 to the five equalizer counters are shown in FIG. 8, these connections are not shown in FIG. 5 so as to maintain the clarity of FIG. 5 and have FIG. 5 more directly correspond to FIG. 5 in the issued U.S. Pat. No. 4,285,065. The outputs of the equalizer counters 221-225 are coupled as selectively readable inputs to the RAM 53 and these connections are shown in both FIG. 5 and FIG. 8 as inputs to the top right side of the RAM 53. The RAM 53, as was previously stated, includes three one by five storage arrays 510, 511 and 512 for storing control signals which are intended for selective connection to the terminals PR1-PR5 in accordance with which of the pushbuttons 502-504 has been actuated. This selection of control signals from the memory storage of the RAM 53 is accomplished in response to which of three RAM control terminals T, F or A provides a high logic state.

The tape player selection pushbutton 502 is directly coupled as an input to the set terminal of a set-reset flip-flop 520 which has its output terminal Q directly coupled to the control terminal T and connected as an input to a rising edge triggerable monostable 521. The pushbutton 503 is directly connected as an input to the set terminal of a set-reset flip-flop 522 that has its output terminal Q directly connected to the control terminal F of the RAM 53 and connected as an input to a rising edge triggerable monostable 523. Similarly, the AM selection pushbutton 504 is directly connected as an input to the set terminal of a set-reset flip-flop 524 that has its output terminal Q directly connected as an input to the control terminal A and connected as an input to a rising edge triggerable monostable 525.

In addition, the output terminals Q of the flip-flops 520, 522 and 524 are also connected to the display 18 and switch 507 so as to selectively illuminate corresponding graphics in the display portion 506 and selectively couple either the tape player, FM radio or AM radio audio output signals to the input terminal 39 of the equalizer circuit 40. As noted before, standard logic gating circuitry can accomplish this desired result since it is contemplated that for actuation of any one of the pushbuttons 502-504 only the corresponding flip-flop 520, 522 or 524 will provide a high logic output signal while the other flip-flops will provide a low logic output signal.

It is contemplated that the output of the flip-flops 520, 522 and 524 will be maintain after actuation of one of the pushbuttons 502-504 until another actuation of one of these pushbuttons. It is also contemplated that actuating one of the pushbuttons, while resulting in the corresponding flip-flop providing a high logic state, will insure that the other two flip-flops will revert to low logic states. This is insured by the presence of OR gates 526-528 which are connected as illustrated in FIG. 8 between the pushbuttons 502-504 and the reset terminals R of the flip-flops.

From the preceeding description of the apparatus in FIG. 8, it can be seen that the flip-flops 520, 522 and 524 selectively provide select control signals at their output terminals Q which select the audio signal source, via switch 507, and select which graphics in display portion 506 will be illuminated. These select control signals also result in selecting which of the stored control signals in the arrays 510-512 in the RAM 53 will be utilized as equalizer control signals. The following paragraph discusses this in more detail.

The monostables 521, 523 and 525 which receive the signals at the output terminals Q of the flip-flops 520, 522 and 524 each respond to a positive going (rising edge) logic state transition by providing a short duration positive logic pulse. The outputs of each of these monostables are coupled as inputs to an OR gate 529 which has its output coupled as an input to a delay circuit 530 whose output is coupled as an input to the preset enable terminal PE of the equalizer counters 221-225. The function of the elements 521, 523, 525 and 529 is to produce an output pulse for each change in entertainment program selection caused by actuation of any of the pushbuttons 502-504. The delay circuit 530 then utilizes this pulse to insure that the equalizer counters 221-225 will be loaded with the proper equalizer control signals that have been previously selected by the control logic signals present at the terminals T, F and A. The reason for the delay circuit 530 is to insure that the loading of the equalizer counters occurs after the proper equalizer control signals stored in the RAM 53 have been coupled to the RAM output terminals PR1-PR5.

The above described circuitry illustrates how actuation of any of the pushbuttons 502-504 selectively creates select control signals at the outputs of the corresponding flip-flops 520, 522 and 524 which result in not only selecting which audio signal source will be utilize for providing the audio signal input to the equalizer circuit 40, but also for simultaneously and automatically selecting which of the three sets of control signals stored in the RAM 53 will be provided as equalizer control signals to the five equalizer counters 221-225. In this manner the present invention has implemented a signal equalization selector which selects a predetermined desired equalization at the same time that the audio signal which is to be equalized is selected.

It should be noted that the present invention, just as the equalizer shown in issued U.S. Pat. No. 4,285,065, contemplates that manual controls 12-17 are provided for allowing the selective independent adjustment of the magnitude of the digital control signals stored in each of the storage arrays 510-512 such that the operator of the entertainment device 10 can preset select the type of equalization he personally desires for each audio signal source which can be selected for the entertainment device, wherein these signal sources correspond to the tape player, the FM radio or the AM radio. The manner in which one array of storage locations in the RAM 53 can be operator programmed so as to reflect any desired equalization characteristic is fully described in the issued U.S. Pat. No. 4,285,065 and will therefore will not be described in detail herein. Briefly, the presetting of the ROM arrays 510-512 to any desired equalization involves allowing the operator of the entertainment device to adjust the count of the equalizer counters 221-225 after these counters have been initially preset, and then selectively load, via the load pushbutton 17, the adjusted count of these counters into any of the storage arrays 510, 511 or 512 which receive read inputs from the equalizer counters by virtue of a connection to the output of the counters 221-225. The mechanism for accomplishing this is described in detailed in the '065 patent. It should be noted that preferably only adjusting the magnitude of the stored control signals which are currently selected by the pushbuttons 502-504 is contemplated by the present invention.

It should be appreciated that the present invention has provided an improvement over the prior art in that operator preset and programmable audio signal equalizations are automatically implemented in accordance with which audio signal source is selected, and this feature has not been obtainable by prior art equalizer apparatus. While I have shown and described specific embodiments of this invention, further modifications and improvements will occur to those skilled in the art. All such modifications which retain basic underlying principles disclosed and claimed herein are within the scope of this invention.

I claim:

1. A signal equalization selector comprising:
    signal source selector means for selecting a first one of a plurality of signal sources for providing a desired selected signal comprising frequencies within a predetermined frequency band;
    equalizer means coupled to said signal source selector means for receiving said selected signal and effectively adjusting the relative emphasis of said selected signal in each of a plurality of subbands within said frequency band, the emphasis of said selected signal in each of said subbands being in accordance with an associated subband equalizer control signal received by said equalizer means for each of said subbands;
    memory means for storing at least a first plurality of predetermined control signals and effectively supplying said first plurality of control signals to said equalizer means as said equalizer control signals while said first one of said plurality of signal sources is selected by said signal source selector means;
    wherein the improvement comprises said memory means storing at least a second plurality of predetermined control signals, and wherein said signal source selector means has structure for selecting a second one of said plurality of signal sources to provide said selected signal and also simultaneously selecting, by selective coupling between said equalizer means and control signals stored in said memory means, said second plurality of control signals, instead of said first plurality of control signals, as said equalizer control signals, whereby equalization for signals derived from said first and second signal sources occurs in accordance with said first and second pluralities of stored control signals, respectively.

2. A signal equalization selector according to claim 1 wherein said equalizer means is responsive to the magnitude of each of said equalizer control signals for determining said relative emphasis of said selected signal in each of said plurality of subbands.

3. A signal equalization selector according to claim 2 wherein said signal source selector means includes at least one manual actuator for manually selecting which of at least said first and second signal sources will provide said selected signal, thereby also selecting which of said first and second pluralities of stored control signals will correspond to said equalizer control signals.

4. A signal equalization selector according to claim 3 wherein said selected signal comprises an audio entertainment signal and wherein said frequency band comprises said audio frequency band.

5. A signal equalization selector according to claim 4 which includes signal adjustment means coupled to said memory means for selectively adjusting the magnitude of each of the signals in said first and second pluralities of control signals stored in said memory means.

6. A signal equalization selector according to claim 5 wherein said signal adjusting means only provides for adjusting the magnitude of the stored control signals which are currently being selected by said selector means as corresponding to said equalizer control signals.

7. A signal equalization selector according to claim 5 wherein said manual actuator corresponds to a pushbutton switch which selects one of said first and second signal sources in accordance with actuation of said pushbutton switch.

8. A signal equalization selector according to any of claims 1, 2, 3, 4, 5 or 6 wherein said signal source selector means selectively provides a first select control signal which selects said first signal source and said first plurality of control signals as said equalizer control signals, and which selectively provides a second select control signal which selects said second signal source and said second plurality of control signals as said equalizer control signals, said selector means selectively providing one of said first and second select control signals.

* * * * *